(12) United States Patent
Lasser et al.

(10) Patent No.: US 8,069,302 B2
(45) Date of Patent: *Nov. 29, 2011

(54) FLASH MEMORY STORAGE SYSTEM AND METHOD

(75) Inventors: Menahem Lasser, Kohav Yair (IL); Mark Murin, Kfar Saba (IL); Arik Eyal, Raanana (IL)

(73) Assignee: Sandisk IL Ltd, Kfar Saba (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/830,001

(22) Filed: Jul. 2, 2010

(65) Prior Publication Data

US 2010/0274955 A1    Oct. 28, 2010

Related U.S. Application Data

(63) Continuation of application No. 11/318,906, filed on Dec. 28, 2005, now Pat. No. 7,752,382.

(60) Provisional application No. 60/715,391, filed on Sep. 9, 2005.

(51) Int. Cl.
*G06F 13/14* (2006.01)
(52) U.S. Cl. .......... 711/103; 711/E12.001; 711/E12.008
(58) Field of Classification Search .................. 711/103, 711/E12.001, E12.008
See application file for complete search history.

(56) References Cited

U.S. PATENT DOCUMENTS

| | | | |
|---|---|---|---|
| 5,341,339 A | 8/1994 | Wells | |
| 5,388,083 A | 2/1995 | Assar et al. | |
| 5,568,423 A * | 10/1996 | Jou et al. | 365/185.33 |
| 5,671,388 A * | 9/1997 | Hasbun | 711/103 |
| 5,712,819 A | 1/1998 | Harari | |
| 5,930,167 A | 7/1999 | Lee et al. | |
| 5,963,480 A | 10/1999 | Harari | |
| 6,230,233 B1 | 5/2001 | Lofgren et al. | |
| 6,570,790 B1 | 5/2003 | Harari | |
| 6,831,865 B2 | 12/2004 | Chang et al. | |
| 2005/0223158 A1 * | 10/2005 | See et al. | 711/103 |
| 2006/0256623 A1 | 11/2006 | Roohparvar | |
| 2007/0061502 A1 | 3/2007 | Lasser et al. | |

OTHER PUBLICATIONS

EPO, "Office Communication," corresponding European Patent Application No. 06796075.7, mailed on Apr. 1, 2009, 7 pages.

Korean Intellectual Property Office, "Notice of Grounds for Rejection," corresponding Korean Patent Application No. 10-2008-7007413, mailed on Oct. 28, 2009, 4 pages (translation only.).

The Patent Office of the People's Republic of China, "Notification of the First Office Action," corresponding Chinese Patent Application No. 200680032767.6, mailed on Feb. 26, 2010, 7 pages (translation only.).

* cited by examiner

*Primary Examiner* — Yong Choe

(74) *Attorney, Agent, or Firm* — Davis Wright Tremaine LLP

(57) ABSTRACT

A flash memory storage system includes a memory array containing a plurality of memory cells and a controller for controlling the flash memory array. The controller dedicates a first group of memory cells to operate with a first number of bits per cell and a second, separate group of memory cells to operate with a second number of bits per cell. A mechanism is provided to apply wear leveling techniques separately to the two groups of cells to evenly wear out the memory cells.

5 Claims, 1 Drawing Sheet

FLASH MEMORY STORAGE SYSTEM AND METHOD

CROSS-REFERENCE TO RELATED APPLICATIONS

This patent application is a continuation of U.S. patent application Ser. No. 11/318,906, filed on Dec. 28, 2005, now U.S. Pat. No. 7,752,382, which claims the benefit of U.S. Provisional Patent Application No. 60/715,391, filed Sep. 9, 2005, which applications are incorporated herein in their entirety by this reference.

FIELD OF THE INVENTION

The present invention relates generally to a flash memory storage system. More particularly, the present invention relates to a flash memory storage system including a cache memory mechanism capable of storing multiple bits per memory cell.

BACKGROUND OF THE INVENTION

A flash memory system implemented as a Multi-Level Cell (MLC) flash memory is provided for storing more than one bit of data on each memory cell. The writing of data into an MLC flash memory is typically slower than the writing of data into a Single-Level Cell (SLC) flash memory that stores only one bit of data per cell. Therefore, a storage system based on an MLC flash memory might not be capable of recording a stream of incoming data transmitted to it at a higher writing rate.

Typically in cases where data is produced at a rate too high to be directly stored, a cache memory mechanism is provided and designed to operate fast enough to handle the incoming data stream. The cache memory utilizing a second (and faster) memory is implemented between the input data source and the main (and slower) memory. The input data stream is first written into the faster cache memory, and at a later stage is copied from this faster cache memory into the main memory. As the copying operation is typically performed in the background, it does not have to meet the strict performance conditions imposed by the input data stream rate, and therefore the lower write performance of the main memory is no longer an obstacle.

However, the implementation of a second memory for caching has its drawbacks. Such implementation requires additional components for the cache memory and its control, and it complicates the design and management of the memory system.

The prior art include U.S. Pat. No. 5,930,167 to Lee et al., which discloses a memory method and system for caching write operations in a flash memory storage system while achieving the benefits of caching in MLC flash memories but with less of the disadvantages. The MLC flash memory media is configured to operate as its own cache memory. This is possible since memory cells that store multiple bits can be further implemented to operate similar to SLC memory cells and store only a single bit each, which is an easier task from a technological point of view. As a result, the MLC memory cells can be implemented to achieve the faster write performance characterizing the SLC flash memory. The Lee patent is incorporated by reference for all purposes as if fully set forth herein.

Known in the art techniques, such as that of Lee et al., provide a "built-in" faster cache memory embedded within the MLC flash memory storage system. When data bits are received for storage, they are first written into memory cells that are set to operate in SLC mode. This first writing operation can be done relatively fast. Following this operation, in the background and when time permits it, the data bits are copied from the SLC cells into memory cells that are set to operate in MLC mode. Thus, as the system is designed to employ the higher storage density of the MLC flash memory storage system, it further handles the faster input stream than could not be handled without the cache memory mechanism.

There are two possible methods for configuring a flash memory system while utilizing such an SLC caching scheme:

A. A dedicated cache—a specific portion of the memory cells is always allocated to operate in SLC mode, while other cells are allocated to operate in MLC mode only. In other words, while memory cells operating in SLC mode (SLC cells) and memory cells operating in MLC mode (MLC cells) co-exist within the storage system at the same time, each specific memory cell is either allocated to operate in SLC mode or in MLC mode, and cannot be alternately allocated to operate in SLC mode at one point in time and in MLC mode at another point in time.

B. A mixed cache—at least some of the memory cells change modes during the system's operation. That is—a specific memory cell may be allocated to operate in SLC mode at one point in time and utilized for caching data, while at a second point in time the same memory cell may be allocated to operate in MLC mode and utilized for high density data storage in the main memory.

The dedicated cache method is much simpler to manage in flash memory systems than the mixed cache method. Each portion of the memory cells is pre-allocated to operate either in SLC mode or in MLC mode. Therefore, no real-time mode switching is required. Furthermore, there is no need to provide an information management module for storing and detecting the current operation mode of any memory portion.

But even though this advantage is clear, the Lee patent discloses a storing system that applies the more complex mixed cache method, per column 2 line 49:

"Nor is it necessary to dedicate some portion of the flash EEPROM memory to operate only as a write cache . . . . Therefore, portions of the flash EEPROM memory of the present invention that store data with the high density can also be operated as a write cache . . . . The identity of the memory sectors being used for long term, high density storage are maintained, such as by a file allocation table, in order to be able to direct low density incoming data to sectors that are unused."

An explanation for utilizing the more complex mixed cache method is further given in the Lee patent, per column 2 line 51:

"Use of a dedicated portion of the memory as a write buffer would cause the cells within that portion to be used much more than other portions of the memory, contrary to the usual desire to evenly wear the memory."

In other words, because each chunk of incoming data is written twice, once in SLC mode (when being cached) and once in MLC mode (when copied to main memory), and since typically the portion of memory cells allocated to the cache memory is much smaller than the portion allocated to the main memory, then over time on average a memory cell allocated only to the cache memory is written and then erased more frequently than a memory cell allocated only to the main memory.

Flash memory cells are known to wear out during use, i.e. the more write/erase cycles they go through, the more wear they suffer. Therefore, according to Lee, memory cells allocated to the cache according to the dedicated cache method, will wear out much faster than the other memory cells, and might reach the end of their lifetime (i.e. the end of their useful functional capability) while the cells not used for the cache are still functioning well.

Therefore, the Lee patent applies the mixed cache method in order to evenly distribute the wear out over all of the memory cells, as no cell is constantly heavily used in the cache.

Actually, the Lee patent could strengthen its argument against utilizing the dedicated method even further, per column 3 line 2:

"... because instances of low density programming can cause more wear than instances of high density programming."

Therefore, not only are the memory cells of the cache memory written more frequently and so tend to wear out more quickly, but also, according to the Lee patent, even under equal number of write/erase cycles—a memory cell configured to operate in SLC mode is worn out earlier than a memory cell configured to operate in MLC mode.

The Lee patent further mentions that there is one case in which the dedicated cache method may be applied, per column 9 line 44:

"Alternatively, in applications where the use of the memory system is not expected to be large enough to require such wear leveling, certain blocks or sectors may be dedicated for the initial two-state data writes."

In other words, if the storage system is written to so infrequently that even without the employing of wear leveling techniques no memory cell is expected to be worn out, then there is place to apply the dedicated cache method.

Techniques for achieving wear leveling in order to evenly distribute the wear out over all of the memory blocks are well known in the art. They include U.S. Pat. No. 6,230,233 to Lofgren et al., U.S. Pat. No. 5,341,339 to Wells, U.S. Pat. No. 5,568,423 to Jou et al., U.S. Pat. No. 5,388,083 to Assar et al., U.S. Pat. Nos. 5,712,819, 6,570,790, and 5,963,480 to Harari, and U.S. Pat. No. 6,831,865 to Chang et al. All of those patents are incorporated by reference for all purposes as if fully set forth herein.

All of the above prior art approaches are based on counting the number of write/erase cycles each block of flash memory cells goes through, and using these counts for deciding on which block to allocate when a new block is needed for writing. Indeed, Lee also uses this approach, going the further step of keeping separate SLC counts and MLC counts for each block.

To summarize, according to the Lee patent—the designer of such a self-cached MLC/SLC flash memory system can select only between the following alternatives:

A. Use the mixed cache method, employ wear leveling techniques, and get a storage system that can stand frequent writing. This is the main and recommended approach.

B. Use the dedicated cache method, do not employ wear leveling techniques, and get a storage system that may be used only where writing of data is infrequent.

However, the main drawback of this approach is that the mixed cache method is much more complex to accomplish and handle, since a real-time mode switching management is required.

Therefore, it is desirable to provide a storage system employing a dedicated cache method, while overcoming the wear-out problems caused from frequently writing to the memory cells.

SUMMARY OF THE INVENTION

Accordingly, it is a principal object of the present invention to overcome the disadvantages of prior art techniques used for employing a dedicated cache method while overcoming wear-out problems caused from frequently writing to the memory cells.

The proposed flash memory storage system includes a flash memory array containing two groups of memory cells. A controller is provided to control the flash memory array by operating a first group of memory cells in SLC mode and a second group of memory cells in MLC mode. Memory cells operating in MLC mode (MLC cells) contain a larger number of bits than SLC cells, such that the bits of the two groups of memory cells are disjoint.

In accordance with a preferred embodiment of the present invention, there is provided a flash memory storage system and method for storing data in a flash memory storage system having a controller and a memory array, the method including the step of:

dedicating a first group of memory cells of the memory array, such that each of the first group of memory cells stores a first number of bits;

dedicating a second group of memory cells of the memory array, such that each of the second group of memory cells stores a second number of bits, wherein the second number of bits is greater than the first number of bits, such that the first group of memory cells and the second group of memory cells are disjoint;

writing the data to the first group of memory cells;

copying the data from the first group of memory cells into the second group of memory cells; and applying a first wear leveling technique within the first group of memory cells to evenly distribute wear of the first group of memory cells within themselves.

In accordance with another method of the present invention, the first number of bits is one and the second number of bits is two.

In accordance with another method of the present invention, the first number of bits is one and said second number of bits is four.

In accordance with another method of the present invention, a ratio between a number of cells of the second group and a number of cells of the first group is set to approximately equal a ratio between an endurance of the first group of memory cells and an endurance of the second group of memory cells multiplied by a ratio between the first number of bits and the second number of bits.

In accordance with another method of the present invention further including the step of:

applying a second wear leveling technique within the second group of memory cells to evenly distribute wear of the second group of memory cells within themselves.

In accordance with another embodiment of the present invention, there is provided a flash memory storage system including:

a memory array containing a plurality of memory cells; and a controller for controlling the flash memory array by dedicating a first group of memory cells to store a first number of bits per cell and a second group of memory cells to store a second number of bits per cell, wherein the second number is greater than the first number, such that the first group of memory cells and the second group of memory cells are disjoint; and a mechanism for applying a first wear leveling technique within the first group of memory cells to evenly distribute wear of the first group of memory cells within themselves.

Additional features and advantages of the invention will become apparent from the following drawing and description.

BRIEF DESCRIPTION OF THE DRAWINGS

For a better understanding of the invention with regard to the embodiments thereof, reference is made to the accompanying drawing, in which like numerals designate corresponding sections or elements throughout, and in which:

The sole FIGURE shows a block diagram of the components comprising the proposed flash memory storage system, in accordance with a preferred embodiment of the present invention.

DETAILED DESCRIPTION OF THE PREFERRED EMBODIMENTS

Figure 1:
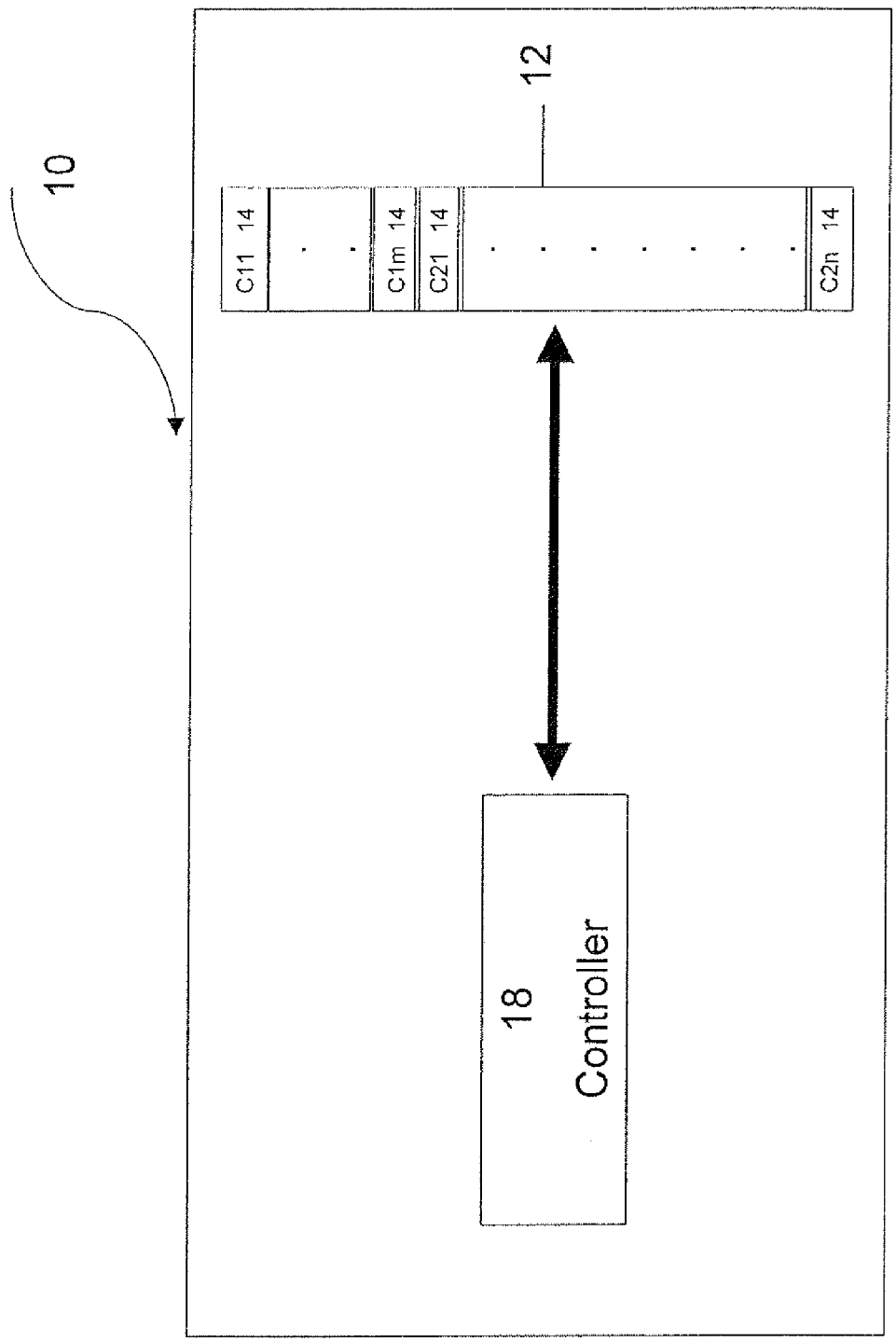

The present invention discloses an innovative flash memory storage system employing a dedicated cache method while overcoming wear-out problems caused from frequently writing to the memory cells.

The proposed flash memory storage system includes a flash memory array containing two groups of memory cells. A controller is provided to control the flash memory array by operating a first group of memory cells in SLC mode and a second group of memory cells in MLC mode. Memory cells operating in MLC mode (MLC cells) contain a larger number of bits than SLC cells, such that the bits of the two groups of memory cells are disjoint (i.e. the two groups of memory cells do not overlap, have no element in common, etc.). Informally, two groups are disjoint if there can be no object that is an instance of both groups.

According to the dedicated cache method, a specific portion of the memory cells is always allocated to operate in SLC mode, while other memory cells are allocated to operate in MLC mode only. In other words, each specific memory cell is either allocated to operate in SLC mode or in MLC mode, and cannot be alternately allocated to operate in SLC mode at one point in time and in MLC mode at another point in time.

Dedicating specific portions of the memory cells to always operate in a specific mode spares the need for carrying out real-time mode switching techniques. There is also no need to provide information management required for identifying the current operation mode of the memory cells. Thus, the overall complexity of the design is simplified.

Memory cells set to operate in SLC mode (i.e. SLC cells) accumulate much less wear than when they are set to operate in MLC mode (i.e. MLC cells). This is due to the fact that the much longer operation time of MLC cells causes more stress on these memory cells and increases the wear.

Furthermore, the wear-out characteristics of SLC cells in MLC flash memory storage systems are similar to SLC cells in typical SLC flash memory storage systems. For example, typical SLC flash memory storage systems have an endurance of 100,000 program/erase cycles compared to only 10,000 program/erase cycles in MLC flash memory storage systems.

The assumptions made in the Lee patent regarding the existence of higher wear when operating in SLC mode (rather than MLC mode) are actually not correct. Either these assumptions were not verified, or the flash memory devices disclosed within the Lee patent presented a different operational behavior than flash memory devices currently known in the art.

Regardless the reason, the fact that operation of the proposed flash memory storage system in SLC mode causes less wear than operation in MLC mode is the crucial factor in making the present invention usable.

Hence, if the SLC cells are used as a cache for the MLC cells, then even though memory cells allocated to the cache go through much more write/erase cycles when applying the dedicated cache method, the better wear characteristics of SLC cells (because of their operation in SLC mode) compensate for this more frequent writing.

Referring now to FIG. 1, there is shown a block diagram of the components of a preferred embodiment of a flash memory storage system 10, in accordance with the present invention. Flash memory storage system 10 includes a memory array 12 containing a plurality of memory cells 14 operating either in SLC mode or MLC mode, depicted as C11 to C1$m$ and C21 to C2$n$ respectively. A controller 16 is further provided for controlling the memory array 12 and writing data to the memory cells 14.

The memory cells 14 have SLC endurance of 200,000 program/erase cycles when storing one bit per cell and MLC endurance of 10,000 program/erase cycles when storing two bits per cell.

The controller 16 controls the memory array 12, such that 9% of the memory cells C11 to C1$m$, operate solely in SLC mode (allocated as SLC cells), and the remaining 91% of the memory cells C21 to C2$n$, operate solely in MLC mode (allocated as MLC cells).

At first glance it may be concluded that on average an SLC cell is cycled approximately ten times more frequently than an MLC cell. But it must be taken into account that by definition—storing a given amount of data into SLC cells takes twice the number of memory cells it takes for storing the same amount of data into MLC cells.

Therefore, the correct conclusion is that on average—each SLC cell C11 to C1$m$ is cycled approximately twenty times more frequently than each MLC cell C21 to C2$n$.

However, as each SLC cell (with endurance of 200,000 program/erase cycles) has approximately twenty times the endurance of each MLC cell (with endurance of 10,000 program/erase cycles), on average both SLC cells and MLC cells, C11 to C1$m$ and C21 to C2$n$ accordingly, wear out and reach the end of their lifetime (i.e. the end of their useful functional capability) at the same time. As a result, the wear of all memory cells 14 is evenly distributed in the system.

Enabling to evenly wear out both SLC cells and MLC cells achieves the optimal result. Thus, the flash memory storage system is useable for the optimal time, contrary to the case where while some memory cells are completely worn out and unusable for storage by the system, other memory cells are still "fresh" and usable.

In order for the above to hold true, flash memory storage system 10 employs wear leveling techniques to evenly spread the wear of the cache cells within themselves. That a wear leveling technique evenly spreads the wear of a group of cells within themselves means that the technique attempts to cause all cells within that group to have similar wear, irrespective of the wear of any cell that is not in the group. So here the wear leveling techniques attempt to cause all cells of the cache to have similar wear, irrespective of the wear of other cells. This is done with SLC write/erase counts (i.e. by counting the number of write/erase cycles in SLC mode exercised by each block of memory cells that is erasable as one group) and using wear leveling techniques known in the art.

Similarly, wear leveling techniques may also be employed to evenly spread the wear of the non-cache cells within themselves. That is—the wear leveling techniques attempt to cause all non-cache cells to have similar wear, irrespective of the wear of other cells. This is done with MLC write/erase counts (i.e. by counting the number of write/erase cycles in MLC mode exercised by each block of memory cells) and again using wear leveling techniques known in the art. Contrary to the Lee patent, there is no need to provide two counts per block, since according to the dedicated cache method each block is either used in SLC mode or in MLC mode but never in both modes, so only one count is needed per block.

In accordance with a preferred embodiment of the present invention, two bits are stored per MLC cell of the memory array. However, the proposed flash memory storage system is not limited to such case. The MLC cells allocated in the memory array may store three bits per cell, four bits per cell, or any other number of bits greater than one. Similarly, the SLC cells need not necessarily store one bit per cell. Each "SLC" cell ("SLC" in quotes because the cell is no longer a single-level cell) may store any number of bits per cell, as long as the number of bits stored per MLC cell is greater than the number of bits per "SLC" cell. As long as this relation is maintained, the write operation to an "SLC" cell is less time consuming than to an MLC cell. Thus, supporting a high rate of input streams is obtained.

Preferably, the ratio between the number of MLC cells and the number of "SLC" cells is set to approximately equal a ratio between the endurance of the "SLC" cells and the endurance of the MLC cells multiplied by a ratio between the number of bits in a "SLC" cell and the number of bits in a MLC cell.

It should be understood that while the flash memory storage system disclosed herein preferably employs a NAND-type flash memory, any other types of flash memories may be employed. Furthermore, other implementations are possible within the scope of the invention, thus relating to any system employing a dedicated cache method while overcoming wear-out problems and providing similar functionalities.

Having described the invention with regard to a certain specific embodiment thereof, it is to be understood that the description is not meant as a limitation, since further modifications will now suggest themselves to those skilled in the art, and it is intended to cover such modifications as fall within the scope of the appended claims.

It is claimed:

1. A flash memory storage system comprising:
a memory array containing a plurality of memory cells; and
a controller for controlling said memory array by dedicating a first group of memory cells from among said plurality of memory cells to store a first number of bits per cell and dedicating a second group of memory cells from among said plurality of memory cells to store a second number of bits per cell, wherein said second number is greater than said first number, and said first group of memory cells and said second group of memory cells are disjoint; and
said controller applying a first wear leveling technique only within said first group of memory cells separately from said memory cells of said second group of memory cells, so as to evenly distribute wear of said first group of memory cells within themselves independent of wear of said second group of memory cell; and
wherein a ratio between a number of said memory cells of said second group of memory cells and a number of said memory cells of said first group of memory cells is set to equal a ratio between an endurance of said first group of memory cells and an endurance of said second group of memory cells multiplied by a ratio between said first number of bits and said second number of bits.

2. The flash memory storage system of claim 1, wherein said controller is further operative to store data in said first group of memory cells and subsequently to copy said data into said second group of memory cells.

3. The flash memory storage system of claim 1, wherein said first number of bits is one and said second number of bits is two.

4. The flash memory storage system of claim 1, wherein said first number of bits is one and said second number of bits is four.

5. The flash memory storage system of claim 1, further comprising said controller applying a second wear leveling technique only within said second group of memory cells, so as to evenly distribute wear of said second group of memory cells within themselves.

* * * * *